(12) United States Patent
Lous

(10) Patent No.: US 7,800,811 B2
(45) Date of Patent: Sep. 21, 2010

(54) SPATIAL LIGHT MODULATOR DEVICE, LITHOGRAPHIC APPARATUS, DISPLAY DEVICE, METHOD OF PRODUCING A LIGHT BEAM HAVING A SPATIAL LIGHT PATTERN AND METHOD OF MANUFACTURING A DEVICE

(75) Inventor: Erik Jan Lous, Veldhoven (NL)

(73) Assignee: NXP B.V., Eindhoven (NL)

( * ) Notice: Subject to any disclaimer, the term of this patent is extended or adjusted under 35 U.S.C. 154(b) by 194 days.

(21) Appl. No.: 11/914,349

(22) PCT Filed: May 8, 2006

(86) PCT No.: PCT/IB2006/051437

§ 371 (c)(1),
(2), (4) Date: Aug. 14, 2008

(87) PCT Pub. No.: WO2006/120634

PCT Pub. Date: Nov. 16, 2006

(65) Prior Publication Data

US 2008/0304030 A1    Dec. 11, 2008

(30) Foreign Application Priority Data

May 13, 2005    (EP) ................... 05104008

(51) Int. Cl.
*G02B 26/00*    (2006.01)
*G03B 27/42*    (2006.01)

(52) U.S. Cl. ........................ 359/292; 355/53

(58) Field of Classification Search ............... 348/615, 348/743, 748, 750, 758; 355/40, 43, 53, 355/67; 359/292, 629, 633, 634; *G03F 7/20, G03F 7/22, 7/26*
See application file for complete search history.

(56) References Cited

U.S. PATENT DOCUMENTS

| 5,936,713 | A  | 8/1999 | Paufler et al. |
| 6,618,185 | B2 | 9/2003 | Sandstrom |

FOREIGN PATENT DOCUMENTS

| EP | 1098291 A2   | 5/2001 |
| WO | 199309472 A1 | 5/1993 |
| WO | 2005064399 A2| 7/2005 |

OTHER PUBLICATIONS

English-language the Written Opinion of the International Search Authority (PCT/ISA/237) prepared for PCT/IB2006/051437 by the European Patent Office (Nov. 13, 2007).*

* cited by examiner

*Primary Examiner*—David N Spector (57) ABSTRACT

The spatial light modulator device (SLM) for providing a spatial light pattern which is alterable in response to an electric signal comprises a first modulator element (ME1) and a second modulator element (ME2). The first light beam (LB1) processed by the first modulator element (ME1) and the second light beam (LB2) processed by the second modulator element (ME2) can be superimposed for forming the spatial light pattern. In this way a defect in the first modulator element (ME1) can be compensated a corresponding pixel of the second modulator element (ME2). The spatial light pattern provided by the first modulator element (ME1) and the second modulator element (ME2) are complementary and combine to the desired spatial light pattern. The spatial light modulator device (SLM) may be used in a lithography apparatus (LA) or a display device (DD).

17 Claims, 4 Drawing Sheets

FIG. 1

Prior Art

FIG. 2

Prior Art

SPATIAL LIGHT MODULATOR DEVICE, LITHOGRAPHIC APPARATUS, DISPLAY DEVICE, METHOD OF PRODUCING A LIGHT BEAM HAVING A SPATIAL LIGHT PATTERN AND METHOD OF MANUFACTURING A DEVICE

The invention relates to a spatial light modulator (SLM) device for providing a spatial light pattern which is alterable in response to an electric signal, the SLM device comprising a modulator element for receiving and in response to an electric signal altering a portion of a light beam.

The invention relates further to a lithographic apparatus comprising such a spatial light modulator device.

The invention relates further to a display device comprising such a spatial light modulator device.

The invention relates further to a method of producing a light beam having a spatial light pattern in which such a spatial light modulator device is used.

The invention relates further to a method of manufacturing a device comprising a lithography step in which such a spatial light modulator device is used.

A spatial light pattern is understood to mean an anisotropic light intensity distribution in a plane perpendicular to a propagation direction of a light beam.

Figure 1:
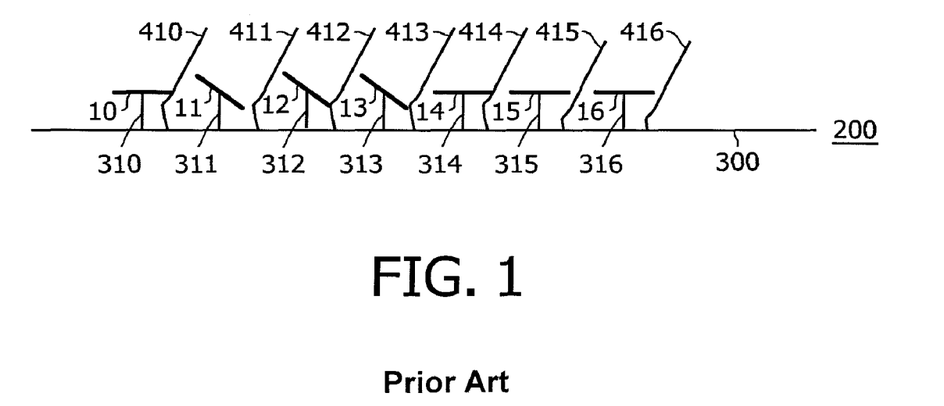
FIG. 1 shows a row of the array of pixels of the known SLM device.

U.S. Pat. No. 6,618,185 B2 discloses a SLM device having an array 200 of pixels a row of which is shown in FIG. 1. The pixels comprise movable micro mirrors 10-16 movably coupled to a substrate 300 by means of support members 310-316. By applying a potential difference to address electrodes 410-416 and movable micro mirrors 10-16, the movable micro mirrors 10-16 may be deflected. The degree of deflection depends on the potential difference between the respective address electrodes and the respective movable micro mirror. When addressed by a properly chosen potential difference the micro mirrors may be arranged such that they are either substantially parallel to the substrate 300, see micro mirrors 10 and 14-16 in FIG. 1, or tilted by substantially the same angle, see micro mirrors 11-13 in FIG. 1.

In practice a SLM device may comprise a defective pixel, i.e. a pixel whose position cannot be controlled sufficiently by applying a potential difference. Such a pixel may be stuck in a specific position, e.g. an on state, an off state, or any state between these two states. In a more general sense, a defective pixel is any pixel the response of which is outside acceptable specifications or operating limits. A defective pixel may contribute too much or too little light to the spatial light pattern. As a result the intended spatial light pattern may not be obtained. When using the spatial light pattern in a lithography method this may result in a defect in the work piece illuminated with the spatial light pattern.

U.S. Pat. No. 6,618,185 B2 discloses a method for compensating a defective pixel in a lithography method. In the method, the work piece is illuminated in a first writing pass with a spatial light pattern having a defect due to a defective pixel, and in a second writing pass with a spatial light pattern which has been compensated for the defect in the first writing pass. This is achieved by using other pixels in the first and second writing pass, respectively. To this end the pixels are calibrated, i.e. the defective pixels are determined. Then the calibrated pixels are used to implement the method for compensating a defective pixel using a first and second writing pass.

Figure 2:
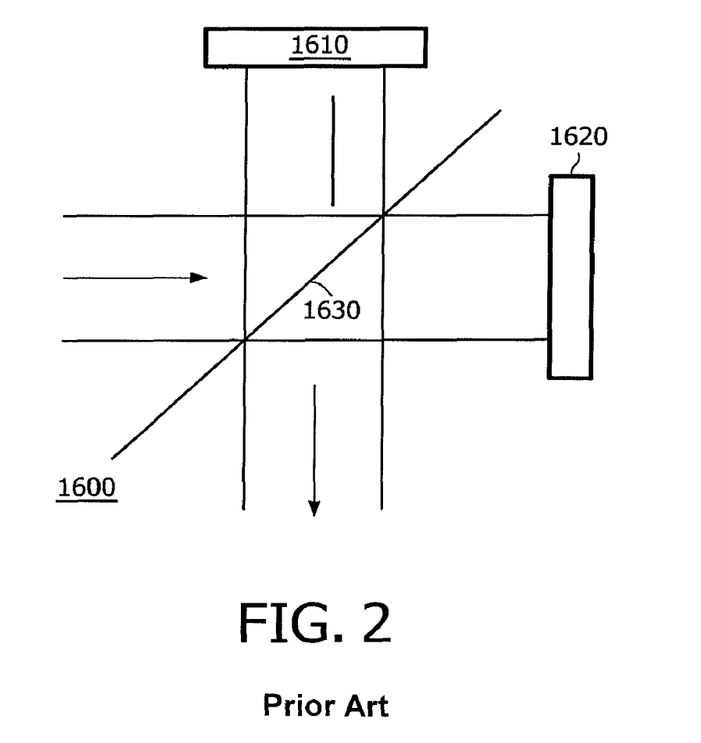
FIG. 2 shows an embodiment of the known SLM device having two arrays of micro mirrors.

U.S. Pat. No. 6,618,185 B2 discloses an embodiment of such a method, shown in FIG. 2, in which a plurality of arrays is used for compensation of bad pixels. FIG. 2 comprises a first SLM 1610 and a second SLM 1620 and a beam splitter 1630. The first SLM 1610 and a second SLM 1620 are fed with the same pattern data. The calibrating functions for individual pixels in the first and second SLM are however unique. The SLM area is calibrated together so that each pixel in the first SLM corresponds to a group of pixels in the second SLM. This is done is both ways. By so doing one will get a one to four relationship of pixels in both directions. Differences of the SLM will in this way be corrected for. Some geometrical errors in the SLM itself are cancelled out if the first SLM is rotated 180 degrees relative to the second SLM. The first and second SLM may be illuminated by the same intensity of electromagnetic radiation. However, by illuminating the first and second SLM by different intensities a further gray scaling may be accomplished. The number of gray-scales will depend upon a relation and absolute value of the two intensities.

It is a disadvantage of the known SLM device that the compensation of a defective pixel requires a first and second writing pass. Adjustment of the voltages for the second writing pass requires a relatively long time, in particular for large arrays of pixels. This renders the operation of the known SLM device relatively slow. When used in a lithography tool the throughput of such a lithography tool is relatively low.

It is an object of the invention to provide a SLM device capable of providing in single writing pass a modulation of a spatial light pattern which is compensated for a defective pixel.

This object is achieved by a SLM device as claimed in claim 1. In the SLM device according to the invention, the first modulator element and the second modulator elements are arranged such that when the pixel of the first modulator element and the pixel of the second modulator element are in their respective first states, the portion of the first light beam and the portion of the second light beam in the spatial light pattern are arranged to substantially coincide. In the spatial light pattern the portion of the second light beam, originating from the pixel in the second modulator element, can substitute the modulation due to the portion of the first light beam in case the pixel of the first modulator element is defective. This implies that one single pixel of the second modulator element can be used to compensate a defect of the pixel in the first modulator element. Because the portion of the first light beam and the portion of the second light beam in the spatial light pattern are arranged to substantially coincide, such a substitution leads to the desired modulation in the spatial light pattern. Thus, a single pixel of the second modulator element having only two different states can be used to substitute the modulation by a pixel in the first modulator element.

In contrast to this, in the known SLM device a defective pixel in the first SLM is compensated by a second writing pass using the same first SLM. The same holds for the second SLM. To this end the pixels of the first and second SLM are each calibrated. The second SLM is then used to increase the dynamic range of the device, i.e. to introduce gray scales. The SLM area is calibrated together so that each pixel in the first SLM corresponds to a group of pixels in the second SLM. In this way the gray scaling is implemented. In general, when the group of pixels in the second modulator element is in the first state, the respective portion of the second light beam does not coincide with the portion of the first light beam. Therefore, the group of pixels cannot simply substitute the pixel of the first modulator element as is the case in the present invention. In the known SLM device this may only be achieved when the electric signals for the micro mirrors of the second modulator element are properly chosen which requires more than simply one signal corresponding to one on state. The micro mirrors each must be addressed with different signals such that the desired compensation is achieved whereas in the SLM device according to the invention just two states are required.

The term "substantially free of the first light beam" implies that there is no significant difference between the situation where the first light beam is incident on the pixel of the first modulator element and where it is not incident on it. The term "substantially free of the second light beam" has the corresponding meaning.

The spatial light modulator device may further comprise a control unit for receiving a desired spatial light pattern, e.g. a spatial light pattern that a user of the spatial light modulation devices wishes to obtain, and for providing the first electric signal and the second electric signal to obtain the desired spatial light pattern. The control unit may be arranged to prevent that the pixel of the first modulator element and the pixel of the second modulator element are simultaneously in their respective first state. This implies that when both the pixel of the first modulator element and the pixel of the second modulator element are functional, i.e. not defective, only one of the following three combined states is obtained: (1) both pixels are in the second state, i.e. none of the pixels contributes light to the spatial light pattern, (2) the pixel of the first modulator element is in the first state while the pixel of the second modulator element is in the second state, i.e. only the pixel of the first modulator element contributes to the spatial light pattern, and (3) the pixel of the second modulator element is in the first state while the pixel of the first modulator element is in the second state, i.e. only the pixel of the second modulator element contributes to the spatial light pattern. In this embodiment the control unit is not usable to have both pixels are in the first state, i.e. both pixels cannot contribute light to the spatial light pattern at the same time. Such a control unit allows to use the first modulator element and the second modulator element complementary, i.e. the pixel of the second modulator element can be chosen instead of the pixel of the first modulator element to contribute light to the spatial light pattern. This embodiment is particularly advantageous when the spatial light pattern is a binary light pattern, i.e. the spatial light pattern is composed of pixels having either a low intensity or a high intensity as it prevents that a pixel may have a intensity which is too high.

The first modulator element may have a single pixel or a plurality of pixels. The plurality of pixels may have all substantially the same size and properties, and may be arranged in an array, like in the known SLM device.

The second modulator element may have a single pixel or a plurality of pixels. The plurality of pixels may have all substantially the same size and properties, and may be arranged in an array.

In an embodiment the first and second modulator elements have identical dimensions and layout. Each pixel of the plurality of pixels of the first modulator element may have a corresponding pixel of the plurality of pixels of the second modulator element such that when a pixel of the plurality of pixels of the first modulator element and the corresponding pixel of the second modulator element are in their respective first states, the respective portions of the first and second light beam in the spatial light pattern are arranged to substantially coincide. This implies that each pixel of the second modulator element can be used to compensate a defect of any pixel in the first modulator element. Because the portion of the first light beam and the portion of the second light beam in the spatial light pattern are arranged to substantially coincide for each pair of pixels of the first modulator element and the corresponding second modulator element, such a substitution does not lead to any defect in the modulation of the spatial light pattern. Thus, a single pixel of the second modulator element having only two different states can be used to substitute the modulation by any pixel in the first modulator element.

In an embodiment a pixel of the first modulator element is defective and the defective pixel is modified such that the spatial light pattern is substantially free of the portion of the first light beam incident on the defective pixel, irrespective of the first electric signal. In general, a defective pixel may contribute to the spatial light pattern, irrespective of the first electric signal. Such a pixel is permanently on. It is then not possible to obtain a spatial light pattern in which the corresponding portion is dark, i.e. free of light. In this embodiment, such an effect is prevented as the defective pixel is modified such that the spatial light pattern is substantially free of the portion of the first light beam incident on the defective pixel, irrespective of the first electric signal. To obtain this effect for all pixels of the first modulator element, substantially all defective pixels of the first modulator element are modified such that the spatial light pattern is substantially free of the portion of the first light beam incident on any of the defective pixels, irrespective of the first electric signal.

When the pixel of the second modulator element corresponding to the defective pixel of the first modulator element is defect-free, this pixel of the second modulator element can be used to compensate the defective pixel of the first modulator element. When each defective pixel of the first modulator element has a corresponding defect-free pixel of the second modulator element, each defective pixel of the first modulator element can be compensated for by the corresponding pixel of the second modulator element. It is then possible to produce any binary spatial light pattern, i.e. a spatial light pattern in which the light has either a high or a low intensity level, even when the first modulator elements has defects, provided that the corresponding pixels of the second modulator elements are defect-free.

Analogously, the second modulator element may have one or more defective pixels. The defective pixel of the second modulator element may be modified such that the spatial light pattern is substantially free of the portion of the second light beam incident on the defective pixel of the second modulator element, irrespective of the second electric signal. Then it is assured that the defective pixel of the second modulator element does not contribute to the spatial light pattern which could lead to a deviation of the actual spatial light pattern from the desired spatial light pattern. When the pixel of the first modulator element corresponding to the defective pixel of the second modulator element is defect-free, this pixel of the first modulator element does not require to be compensated for by the defective pixel of the second modulator element. Preferably, all pixels of the first modulator element corresponding to a defective pixel in the second modulator element are defect-free.

A pixel of the first and/or second modulator element may have a reflection which is alterable in response to the first and/or second electric signal, respectively. The alterable reflection of the modulator cell may result in a re-direction and/or in a phase change of the light beam incident on the modulator cell. Alternatively, or in addition, the first and/or second modulator cell may have a transmission which is alterable in response to the first and/or second electric signal, respectively.

The pixel may comprise one or more micro mirrors similar to the micro mirrors of the known SLM. Alternatively, or in addition, the pixel may comprise a liquid crystal (LC) cell which is capable of introducing a change in index of refraction along an axis. The LC cell may be used to change the amplitude and/or direction of the light incident thereon, in response to an electric signal applied to the LC cell. The LC cell may be operated in transmission or in reflection.

Instead of an LC cell a cell based on electro-wetting as described in the international patent application with application number IB2004/052620 and in the European patent application with application number 03104914.1, both being assigned to the applicant of the present application and having the internal reference number PHNL031520, may be used.

In an embodiment the means for superimposing the first light beam processed by the first modulator element and the second light beam processed by the second modulator element comprise a semitransparent optical element which transmits the first light beam processed by the first modulator element and reflects the second light beam processed by the second modulator element such that the first light beam processed by the first modulator element and the second light beam processed by the second modulator element are combined to a combined light beam. Alternatively, the means for superimposing the first light beam processed by the first modulator element and the second light beam processed by the second modulator element may comprise a semitransparent optical element which is arranged to transmit the second light beam processed by the second modulator element and to reflect the first light beam processed by the first modulator element such that the second light beam processed by the second modulator element and the first light beam processed by the first modulator element are combined to a combined light beam. In this way the combined light pattern may be conveniently transported as both the first and second processed light beam are collinear. The semitransparent optical element may be a beam splitter such as a polarizing beam splitter.

In an alternative embodiment the processed first and second light beam are superimposed non-collinearly, i.e. in a spatially confined region such as a plane. This may be achieved by a mirror or lens with which the second processed light beam is directed to the first processed light beam, or vice versa.

In an embodiment the pixel of the first and/or second modulator element is in the second state when no first and/or second electric signal, respectively, is present. As a consequence the pixel of the modulator element does not contribute to the spatial light pattern in case the electric signal is not provided properly due to e.g. a defective electric connection. It may then be possible to compensate this by providing a corresponding pixel of the other modulator element with an electric signal.

In an embodiment the SLM device further comprises a beam splitting element for receiving an input light beam and for splitting the input light beam into the first light beam and the second light beam. This allows for the use of a single light source providing a single input light beam which is cost effective. In an alternative embodiment the first and second modulator element are arranged to receive the first and second light beam for a first and second different light source, respectively. This has the advantage that the spatial light pattern may have a relatively large power.

The beam splitting element may be arranged to function also as the semitransparent optical element for superimposing the first light beam processed by the first modulator element and the second light beam processed by the second modulator element. This allows for a relatively compact SLM device with a relatively small number of optical components.

An aspect of the present invention relates to a lithographic apparatus for irradiating a layer of an actinic material provided on a work piece by actinic radiation having a spatial light pattern. The lithographic apparatus comprises a light source for providing the actinic radiation and a SLM device according to the invention, as described in any of the embodiments above, arranged to receive the actinic radiation provided by the light source. The SLM device is arranged to modulate the received actinic radiation such that the modulated actinic radiation has the spatial light pattern. The actinic radiation having the spatial light pattern may then be provided to the layer of actinic material.

The lithographic apparatus may be a mask-less lithographic apparatus which allows for performing lithography without needing a mask. Mask-less lithography is known per se and a lithographic apparatus having a SLM device based on an array of micro-mirrors is described in U.S. Pat. No. 6,618, 185 B2.

The SLM device may be a chip with e.g. micro-mirrors that can locally change the photon density in the layer of actinic material. The photon density pattern reflects the information that in conventional lithography is encrypted in the mask. The micro-mirrors may be electronically driven. Pattern data are directly sent by electronic, digital means to the chip. The larger the modulator element, the larger the throughput of the lithographic apparatus can be. On the modulator element each pixel such as a single micro-mirror or group of micro-mirrors, called super pixel, represents a spot point in the layer of actinic material. This implicates, however, that since no such spot may fail, the modulator element must be defect-free at the level of each pixel or super pixel, if present. This limits the size of the modulator element and hence the throughput of the lithographic apparatus.

According to an embodiment of the invention the actinic layer is exposed by 2 (or more) modulator elements, which spatial light patterns are combined to a combined spatial light pattern in the actinic layer. The two-modulator elements together define the complete spatial light pattern in the actinic layer. The modulator elements may have defective pixels such as defective mirrors, but preferably the portion of light processed by these defective pixels do not coincide in the spatial light pattern.

An aspect of the present invention relates to a display device for displaying an image. The display device comprises a light source for providing a light beam, and a SLM device according to the invention, as described in any of the embodiments above, arranged to receive the light beam provided by the light source, to modulate the received light beam such that the modulated light beam has a spatial light pattern corresponding to the image and to provide the light beam having the spatial light pattern to a display surface. The display device may comprise more than one, e.g. three, light sources for providing more than one, e.g. three, light beams of different colors, e.g. red, green and blue. Each light beam provided by the light sources may be modulated by one SLM according to the invention. Alternatively, two or more, if present, light beams may be modulated by different parts of one and the same SLM device according to the invention.

These and other aspects of the present invention will be further elucidated with reference to the drawings in which.

Figure 3:
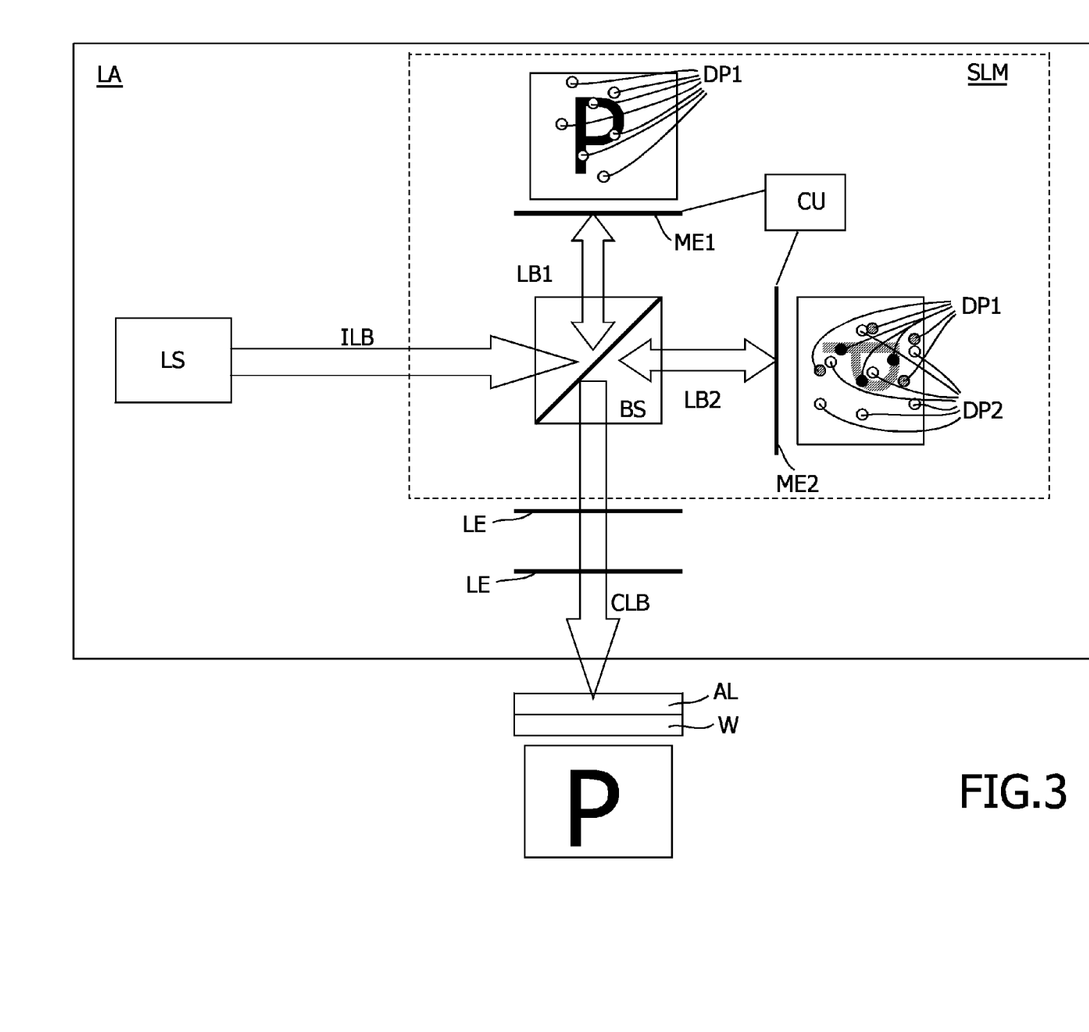
FIG. 3 schematically shows a lithography apparatus having an SLM device according to the invention.

The lithographic apparatus LA shown in FIG. 3 is suitable for irradiating a layer AL of an actinic material provided on a work piece W by actinic radiation having a spatial light pattern denoted in this example as a "P". The actinic material may be a photo resist commonly used in lithography. The solubility of the actinic material may be altered by irradiating the material with actinic radiation. In an embodiment the portions of the actinic layer irradiated by the actinic radiation become soluble and can be removed whereas the non-irradiated portions remain insoluble in a developer solution. In another embodiment the portions of the actinic layer irradiated by the actinic radiation remain insoluble and cannot be removed whereas the non-irradiated portions are insoluble in a developer solution and can be removed. The two types of actinic material are often referred to as positive resist and negative resist, respectively.

The work piece W may be a any type of substrate such as a silicon wafer on which patterned layers of e.g. insulating material such as silicon oxide and electrically conductive material such as doped silicon, aluminum or copper may be arranged. The substrate may be a transparent insulating layer on which a liquid crystal (LCD) display is to be produced. On the substrate may be a layer which is to be patterned by means of lithography followed by a material removal treatment such as e.g. etching. The developed layer of actinic material may serve as a mask in the material removal treatment. The layer to be patterned may be a conductive layer of e.g. a doped semiconductor material or a metal. Alternatively it may be an insulating layer such as e.g. silicon dioxide.

The lithographic apparatus LA comprises a light source LS for providing the actinic radiation. In this example the light source LS is an excimer laser emitting a wavelength of 248 nm. In another embodiment the LS emits infrared (IR), visible or ultraviolet (UV) radiation.

The light beam emitted by the light source LS is referred to as incoming light beam ILB and can be fed into a spatial light modulator device SLM, i.e. the spatial light modulator device SLM is arranged to receive the actinic radiation provided by the light source LS. The spatial light modulator device SLM is able to modulate the received actinic radiation such that the modulated actinic radiation has the spatial light pattern and to provide the actinic radiation having the spatial light pattern to the layer AL of actinic material.

The spatial light modulator device SLM comprises a beam splitting element BS for receiving an input light beam ILB and for splitting the input light beam into the first light beam LB1 and the second light beam LB2. In this embodiment the beam splitting element BS is a polarizing beam splitter. It may be substituted by any other suitable beam splitting element such as e.g. a semitransparent flat optical element. In another embodiment, not shown, two separate light sources may be used. The two separate light sources may be arranged to emit light of substantially the same wavelength.

The spatial light modulator device SLM comprises a first modulator element ME1 with a pixel for receiving and in response to a first electric signal processing the first light beam LB1, and a second modulator element ME2 with a pixel for receiving and in response to a second electric signal processing a second light beam LB2. The first and second modulator elements ME1 and ME2 are both arrays of micro mirrors similar to those of known SLM device. The pixel may be formed by a single micro mirror or by a number of micro mirrors forming a so-called super-pixel. The array may have a size of 1000 times 1000 micro mirrors but the invention is not limited to an array having a rectangular layout nor to an array having this size. The first and second modulator elements ME1 and ME2 may have the same size and layout.

The orientation of the micro mirrors in the arrays may be adjusted by applying a potential difference between the micro mirrors 10-16 and the electrodes 410-416 shown in FIG. 1, analogously to the known SLM device. When the micro mirrors are substantially parallel to the substrate 300, see micro mirrors 10 and 14-16 in FIG. 1, the light beam LB1 or LB2, respectively, is normally incident, i.e. incident perpendicular to the surface of the micro mirrors. The surface of the micro mirrors is reflective, e.g. coated by a layer of aluminum, and the micro mirrors substantially parallel to the substrate 300 return the light beam LB1 or LB2, respectively. The micro mirrors which are tilted with respect to the substrate 300, see micro mirrors 11-13 in FIG. 1, reflect the portion of the light beam incident thereon in another direction towards a beam dump, not shown, in which the respective portion of the light beam is absorbed.

In this way the first and second modulator element ME1 and ME2 process the first and second light beam LB1 and LB2, respectively, where the processing depends on the potential difference applied to the respective electrodes 410-416 and the micro mirrors 10-16. The potential differences applied to the respective electrodes 410-416 and the micro mirrors 10-16 of the first and second modulator element ME1 and ME2 are referred to as first and second electric signal, respectively.

As a result of the processing the first and second light beam LB1 and LB2 each have a spatial light pattern which is alterable by means of the micro mirrors in the first and second modulator element ME1 and ME2, respectively. The first light beam processed by the first modulator element ME1 and the second light beam processed by the second modulator element ME2 are superimposed by a semitransparent optical element BS which is arranged to transmit the first light beam processed by the first modulator element ME1 and to reflect the second light beam processed by the second modulator element ME2 such that the first light beam processed by the first modulator element ME1 and the second light beam processed by the second modulator element ME2 are combined to a combined light beam CLB. The combined light beam CLB has a spatial light pattern which is a superposition of the spatial light pattern of the processed first and second light beam. Thus, the spatial light modulator device SLM is able to provide a spatial light pattern which is alterable in response to an electric signal. The electric signal comprises the first electric signal applied to the first modulator element ME1 and the second electric signal applied to the second modulator element ME2.

The combined light beam CLB is focused by means of two lenses LE on the layer AL of actinic material. The lenses LE demagnify the spatial light pattern, e.g. by a factor of 4. In another embodiment the spatial light pattern is not demagnified. The spatial light pattern provided by the spatial light modulator device SLM may have features which are so small that they cannot be observed by the human eye unless they are first magnified.

In this embodiment the beam splitting element BS is arranged to function also as the semitransparent optical element for superimposing the first light beam processed by the first modulator element and the second light beam processed by the second modulator element. In another embodiment, not shown, two separate optical elements are used.

The pixels of the first modulator element ME1 have in response to the first electric signal adjustable states comprising a first state for processing the first light beam LB1 such that a portion of the first light beam LB1 incident on the pixel is part of the spatial light pattern, e.g. micro mirrors 10 and 14-16 which are parallel to substrate 300, and a second different state for processing the first light beam LB1 such that the spatial light pattern is substantially free of the portion of the first light beam LB1, e.g. micro mirrors 11-13 which are tilted with respect to the substrate 300. Analogously, the pixels of the second modulator element ME2 have in response to the second electric signal adjustable states comprising a first state for processing the second light beam LB2 such that a portion of the second light beam LB2 incident on the pixel is part of the spatial light pattern, and a second different state for processing the second light beam LB2 such that the spatial light pattern is substantially free of the portion of the second light beam LB2. The pixels of the first and second modulator elements ME1 and ME2 thus have a reflection which is alterable in response to the first and second electric signal, respectively.

The first modulator element ME1 and the second modulator element ME2 each comprise a plurality of pixels, in this embodiment the arrays of micro mirrors. Each pixel of the plurality of pixels of the first modulator element ME1 has a corresponding pixel of the plurality of pixels of the second modulator element ME2 such that when a pixel of the plurality of pixels of the first modulator element ME1 and the corresponding pixel of the second modulator element ME2 are in their respective first states, e.g. parallel to the respective substrate 300, the respective portions of the first and second light beam in the spatial light pattern are arranged to substantially coincide.

The first modulator element ME1 and the second modulator element ME2 are mounted to a common support structure, not shown. In an embodiment, the position of the second modulator element ME2 with respect to the first modulator element ME1 is adjustable as to arrange that the portions of the respective portions of the first and second light beam in the spatial light pattern substantially coincide.

The spatial light modulator device SLM comprises a control unit CU for receiving a desired spatial light pattern and for providing the first electric signal and the second electric signal to obtain the desired spatial light pattern. In this embodiment, the control unit CU is a computer and the desired spatial light pattern is a "P" but the invention is not limited to this desired spatial light pattern which is used solely for illustrating the invention.

A front view of the first modulator element ME1 as seen by the first light beam LB1 is shown schematically in FIG. 3 on top of the solid black line ME1 representing a cross section the first modulator element ME1. The first modulator element ME1 has number of defective pixel DP1 which are indicated in the front view of the first modulator element ME1 in FIG. 3 by means of open circles. Some of the defects coincide with the desired spatial light pattern, i.e. are within the "P". Using the first modulator element ME1 alone would result in a spatial light pattern having defects. Defective pixels outside the "P" may contribute to the spatial light pattern while defective pixels inside the "P" may not contribute to the spatial light pattern.

Substantially all defective pixels of the first modulator element ME1 are modified such that the spatial light pattern is substantially free of the portion of the first light beam LB1 incident on any of the defective pixels DP1, irrespective of the first electric signal. This is achieved by laser ablation of the aluminum layer of the defective micro mirrors. Alternatively, any other suitable masking technique may be used. As a result, the defective pixels DP1 of the first modulator element ME1 do not contribute to the spatial light pattern.

The spatial light pattern obtained only by using the first modulator element ME1 is not equal to the desired "P". It has a number of holes in the pattern due to the defective pixels in the first modulator element ME1. The control unit CU provides a second electric signal to those pixels of the second modulator element ME2, which correspond to the defective pixels of the first modulator element ME1 causing the holes in the pattern, such that the holes are filled with portions of the second light beam LB2.

A front view of the second modulator element ME2 as seen by the second light beam LB2 is shown schematically in FIG. 3 right to the solid black line ME2 representing a cross section the second modulator element ME2. In the front view of the second modulator element ME2 the part of the pattern "P" as provided by the first modulator element ME1 is shown in gray. The holes to be filled in the pattern "P" as provided by the first modulator element ME1 by the second modulator element ME2 are shown by black circles, indicating the pixels of the second modulator element ME2 providing portions of the second light beam LB2 back towards the beam splitter BS and to the combined light beam CLB.

Thus, the second modulator element ME2 provides those parts of the spatial light pattern which are not provided by the first modulator element ME1. As a result the desired spatial light pattern may be obtained, even when defects are present in the first and second modulator elements ME1 and ME2.

In this embodiment the second modulator element ME2 has number of defective pixel DP2 which are indicated in the front view of the second modulator element ME2 in FIG. 3 by means of open circles. The defective pixels DP2 of the second modulator element ME2 correspond to defect-free pixels of the first modulator element ME1. Analogously, the pixel of the second modulator element ME2 corresponding to defective pixels DP1 of the first modulator element ME1, shown in the front view of ME2 by means of gray circles, are defect-free. Thus, a defect-free desired spatial light pattern may be obtained.

The control unit CU comprises a memory in which the positions of the defective pixels DP1 in the first modulator element ME1 are stored. When the desired pattern would require such a defective pixel DP1 to contribute a portion of the first light beam LB1 to the spatial light pattern, the control unit CU activates instead of the defective pixel DP1 the corresponding pixel in the second modulator element ME2 such that this corresponding pixel contributes a portion of the second light beam LB2 instead of the portion of the first light beam LB1 to the combined light beam CLB to obtain the desired spatial light pattern. This implies that the control unit CU is arranged to prevent that a pixel of the first modulator element ME1 and the corresponding pixel of the second modulator element ME2 are simultaneously in their respective first state.

In another embodiment, the control unit CU is arranged use an approximately equal number of pixels of the first modulator element ME1 and of the second modulator element ME2 to obtain the desired spatial light pattern. Other combinations of the pixels of the first modulator element ME1 and of the second modulator element ME2 are possible as well, provided the desired spatial light pattern is obtained.

Figure 4:
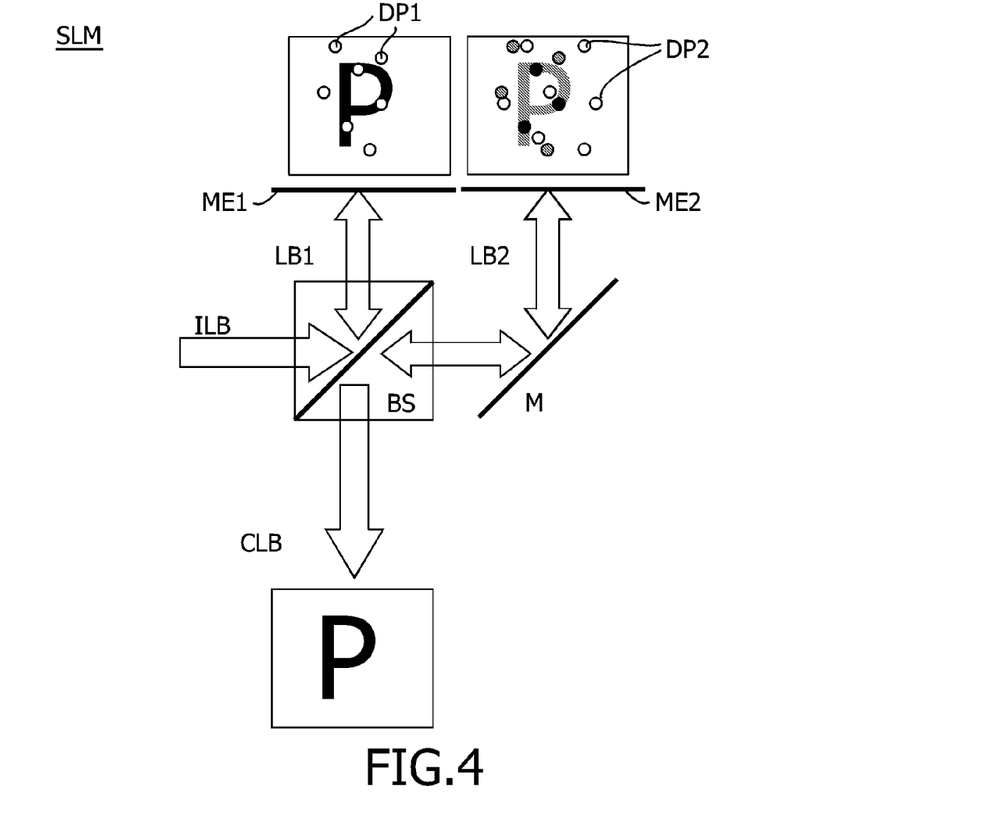
FIG. 4 schematically shows another embodiment of the SLM device according to the invention.

In an alternative embodiment of the spatial light modulator device SLM shown in FIG. 4, the first modulator element ME1 and the second modulator element ME2 are arranged in the same plane which simplifies the alignment of the first modulator element ME1 and the second modulator element ME2. The first modulator element ME1 and the second modulator element ME2 may be integrated in one and the same array of micro mirrors which simplifies the alignment even further. The incoming light beam ILB is divided by the beam splitter BS in the first light beam LB1 which is directed to the first modulator element ME1, and the second light beam LB2 which is directed to the second modulator element ME2 via the mirror M.

Analogous to the embodiment of FIG. 3, the first light beam LB1 processed by the first modulator element ME1 and the second light beam LB2 processed by the second modulator element ME2 are combined to a combined light beam CLB by means of the beam splitter BS. The control unit CU may be connected to the first and second modulator element ME1 and ME2, in a way analogously to the embodiment of FIG. 3.

Figure 5:
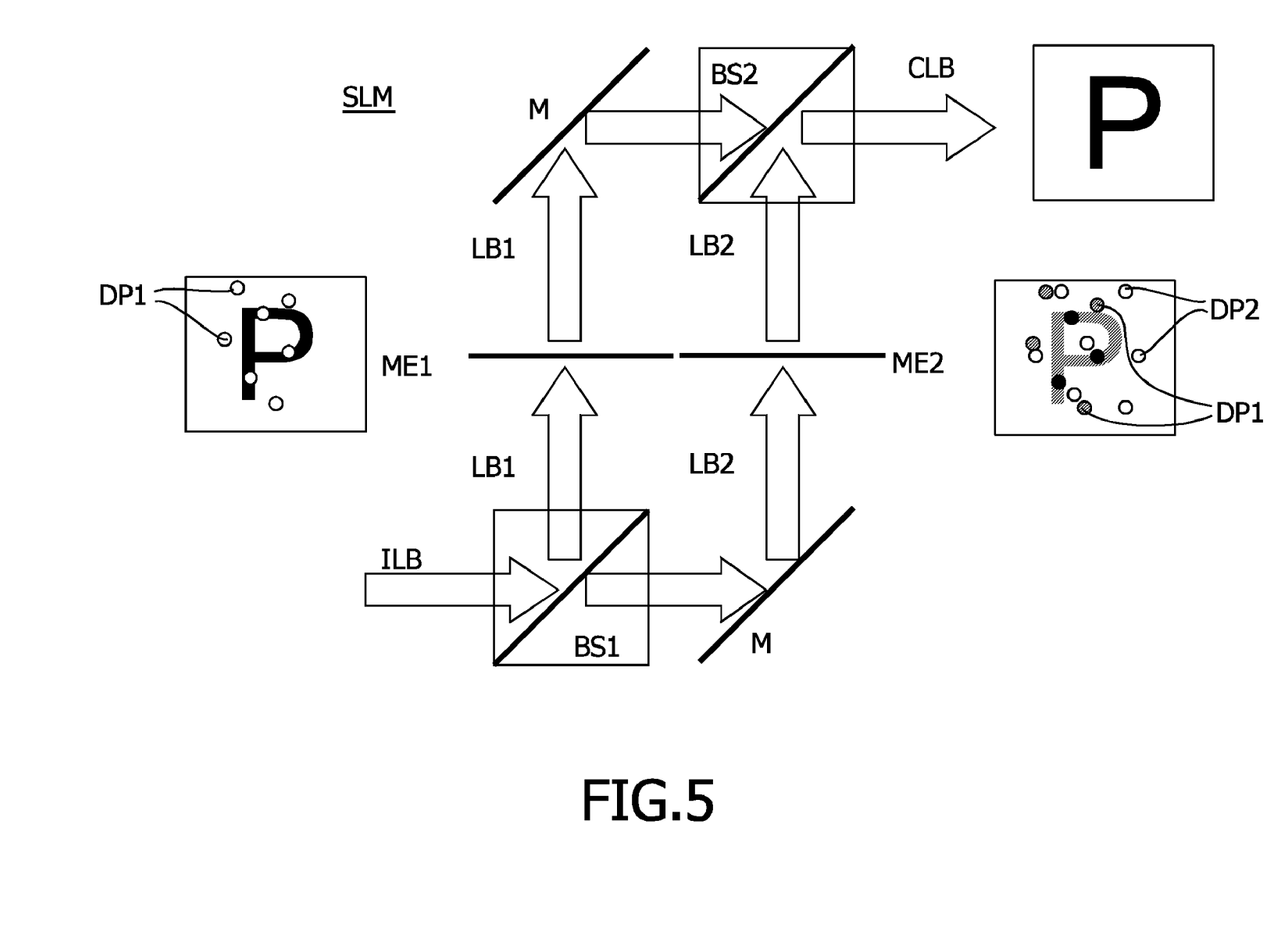
FIG. 5 schematically shows yet another embodiment of the SLM device according to the invention.

The spatial light modulator device SLM shown in FIG. 5 has first and second modulator elements ME1 and ME2 each of which comprises an array of pixels having a transmission which is alterable in response to the first and second electric signal, respectively. The pixels may be liquid crystal (LC) cells which have a transmission for polarized light depending on the orientation of the liquid crystal molecules in the LC cell. The orientation of the liquid crystal molecules may be controlled by applying a voltage to the LC cell. The SLM device of FIG. 5 may be operated using a polarized incoming light beam ILB of which the first and second light beam LB1 and LB2 are split off by means of a first beam splitter BS1. The first and second light beam LB1 and LB2 may be processed by the modulator elements ME1 and ME2 and the processed first and second light beam LB1 and LB2 may be superimposed by means of a second beam splitter BS2 to obtain a combined light beam CLB having the desired spatial light pattern. Again, the control unit CU may be connected to the first and second modulator element ME1 and ME2, in a way analogously to the embodiment of FIG. 3. The LC cells of the first and second modulator element ME1 and ME2 may be integrated in one and the same device. Alternatively, they may be realized by two separate devices.

Instead of, or in addition to, LC cells the first and/or second modulator element may comprise electro-wetting cells as described in the international patent application with application number IB2004/052620 and in the European patent application with application number 03104914.1, both being assigned to the applicant of the present application and having the internal reference number PHNL031520.

Instead of the SLM device shown in FIG. 3 the SLM devices shown in FIGS. 4 and 5 may be used in the lithography apparatus LA.

The first and second modulator elements ME1 and ME2 may be arranged to receive the first and second light beam LB1 and LB2 alternatingly, i.e. in a first period of time the first modulator element ME1 is arranged to receive the first light beam LB1 while the second modulator element ME2 is arranged to not receive the second light beam LB2, and in a second period of time different from the first period of time the second modulator element ME2 is arranged to receive the second light beam LB2 while the first modulator element ME1 is arranged to not receive the first light beam LB1. This may be achieved by using appropriate shutter in the path of the first and second light beam LB1 and LB2 or, when the first and second light beam LB1 and LB2 are emitted by different light sources, by shutting down the respective light source. In this embodiment the total light intensity incident on the SLM device is reduced by a factor of 2 which is advantageous in cases where dissipation is an issue.

The SLM device may have, e.g. rectangular or square, micro mirrors having a length and width of 1-20 micro meter. They may be arranged in an, e.g. rectangular or square, array having a size of 1-200 cm².

Figure 6:
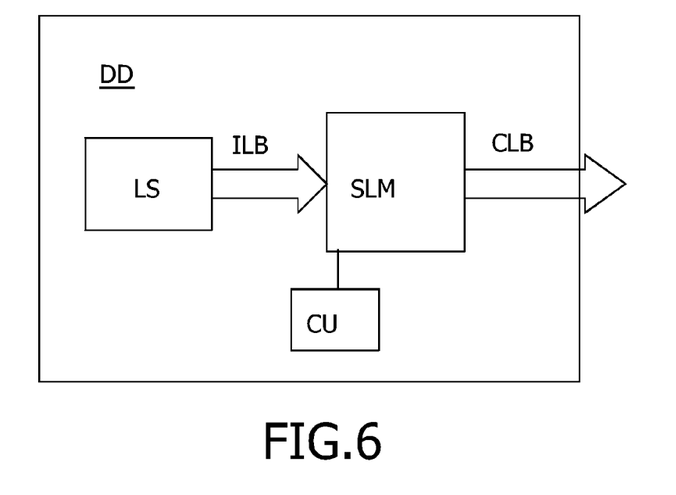
FIG. 6 shows a display device for displaying an image having an SLM device according to the invention.

A spatial light modulator device SLM as shown in any of FIGS. 3, 4 and 5 may be used in a display device DD for displaying an image, shown in FIG. 6. The display device DD comprises a light source LS for providing a light beam and a spatial light modulator device SLM arranged to receive the light beam ILB provided by the light source LS. The spatial light modulator device SLM is connected to a control unit CU which is arranged to provide the first and second electric signal as to modulate the received light beam such that the modulated light beam has a spatial light pattern corresponding to the image. The light beam CLB having the spatial light pattern may then be provided to a display surface, not shown. The display surface may or may not be part of the display device DD according to the invention.

In summary, the spatial light modulator device SLM for providing a spatial light pattern which is alterable in response to an electric signal comprises a first modulator element ME1 and a second modulator element ME2. The first light beam LB1 processed by the first modulator element ME1 and the second light beam LB2 processed by the second modulator element ME2 can be superimposed for forming the spatial light pattern. In this way a defect in the first modulator element ME1 can be compensated a corresponding pixel of the second modulator element ME2. The spatial light pattern provided by the first modulator element ME1 and the second modulator element ME2 are complementary and combine to the desired spatial light pattern. The spatial light modulator device SLM may be used in a lithography apparatus LA or a display device DD.

The invention claimed is:

1. A spatial light modulator device for providing an alterable spatial light pattern, the spatial light modulator device comprising:
   a first modulator element with a pixel for receiving and, in response to a first electric signal, processing a light beam incident thereon,
   a second modulator element with a pixel for receiving and in response to a second electric signal, processing a light beam incident thereon,
   signal-processing circuitry; and
   light-directing elements configured and arranged with the signal-processing circuitry configured, in response to the respective first and second electric signals, for operating the pixels in two opposing binary states to facilitate formation of the spatial light pattern with the respectively-processed light beams being aligned, the states including
      a first state for processing the first light beam such that a portion of the light beam incident on the pixel is part of the spatial light pattern and
      a second different state for processing the light beam incident on the pixel such that the spatial light pattern is substantially free of the portion of the light beam.

2. Spatial light modulator device as claimed in claim 1, wherein the signal-processing circuitry is configured and arranged for receiving a desired spatial light pattern and for providing the first electric signal and the second electric signal to obtain the desired spatial light pattern, the control signal-processing circuitry being arranged to prevent the pixel of the first modulator element and the pixel of the second modulator element arc from being simultaneously in their respective first state.

3. Spatial light modulator device as claimed in claim 1, wherein the pixels of the first and second modulator elements have a reflection which is alterable in response to the first and second electric signals, respectively.

4. Spatial light modulator device as claimed in claim 1, wherein a the pixels of the first and second modulator elements have a transmission which is alterable in response to the first and/or second electric signals, respectively.

5. Spatial light modulator device as claimed in claim 1, further comprising a beam splitting element for receiving an input light beam and for splitting the input light beam into the light beam incident on the first modulator element and the light beam incident on the second modulator element.

6. Method of manufacturing a device comprising a lithography step in which a spatial light modulator device as claimed in claim 1 is used.

7. Spatial light modulator device as claimed in claim 1, wherein the first modulator element and the second modulator element each comprise a plurality of pixels, each pixel of the plurality of pixels of the first modulator element having a corresponding pixel of the plurality of pixels of the second modulator element such that when a pixel of the plurality of pixels of the first modulator element and the corresponding pixel of the second modulator element are in their respective first states, the respective portions of the light beams in the spatial light pattern are arranged to substantially coincide.

8. Spatial light modulator device as claimed in claim 7, wherein a pixel of the first modulator element is defective, the defective pixel being modified such that the spatial light pattern is substantially free of the portion of the light beam incident on the defective pixel, irrespective of the first electric signal.

9. Spatial light modulator device as claimed in claim 8, wherein substantially all defective pixels of the first modulator element are modified such that the spatial light pattern is substantially free of the portion of the first light beam incident on any of the defective pixels, irrespective of the first electric signal.

10. Spatial light modulator device as claimed in claim 8, wherein the pixel of the second modulator element corresponding to the defective pixel of the first modulator element is defect-free.

11. Spatial light modulator device as claimed in claim 1, wherein the light directing elements include a semitransparent optical element which is arranged to transmit the light beam processed by the first modulator element and to reflect the light beam processed by the second modulator element such that the light beam processed by the first modulator element and the light beam processed by the second modulator element are combined to a combined light beam.

12. Spatial light modulator device as claimed in claim 11, wherein the beam splitting element is arranged to function also as the semitransparent optical element for superimposing the light beam processed by the first modulator element and the light beam processed by the second modulator element.

13. Lithographic apparatus for irradiating a layer of an actinic material provided on a work piece by actinic radiation having a spatial light pattern, the lithographic apparatus comprising:
 a light source for providing the actinic radiation, and
 a spatial light modulator device including,
  a first modulator element, with a pixel, for receiving and in response to a first electric signal, processing a light beam incident thereon,
  a second modulator element, with a pixel, for receiving and in response to a second electric signal processing a light beam incident thereon,
  signal-processing circuitry; and
  light-directing elements configured and arranged with the signal-processing circuitry configured, in response to the respective first and second electric signals, for operating the pixels in two opposing bipolar states to facilitate formation of the spatial light pattern with the respectively-processed light beams being aligned, the states including
   a first state for processing the light beam such that a portion of the light beam incident on the pixel is part of the spatial light pattern and
   a second different state for processing the light beam incident on the pixel such that the spatial light pattern is substantially free of the portion of the light beam, and
  the spatial light modulator device arranged to receive the actinic radiation provided by the light source, to modulate the received actinic radiation such that the modulated actinic radiation has the spatial light pattern and to provide the actinic radiation having the spatial light pattern to the layer of actinic material.

14. Display device for displaying an image, the display device comprising:
 a light source for providing a light beam, and
 a spatial light modulator device including,
  a first modulator element, with a pixel, for receiving and in response to a first electric signal, processing a light beam incident thereon,
  a second modulator element, with a pixel, for receiving and in response to a second electric signal processing a light beam incident thereon,
  signal-processing circuitry; and
  light-directing elements configured and arranged with the signal-processing circuitry configured, in response to the respective first and second electric signals, for operating the pixels in two opposing bipolar states to facilitate formation of the spatial light pattern with the respectively-processed light beams being aligned, the states including
   a first state for processing the light beam such that a portion of the light beam incident on the pixel is part of the spatial light pattern and
   a second different state for processing the light beam incident on the pixel such that the spatial light pattern is substantially free of the portion of
  the light beam, and
  the spatial light modulator device arranged to receive the light beam provided by the light source, to modulate the received light beam such that the modulated light beam has a spatial light pattern corresponding to the image and to provide the light beam having the spatial light pattern to a display surface.

15. Method of producing a light beam having a spatial light pattern, the method comprising the steps of:
 processing a first light beam by a first modulator element having a defective pixel,
 processing a second light beam by a second modulator element having a defect-free pixel, and
 superimposing the first light beam processed by the first modulator element and the second light beam processed by the second modulator element such that light processed by the defect-free pixel of the second modulator element substitutes light processed by the defective pixel of the first modulator element for forming the spatial light pattern.

16. Method as claimed in claim 15, wherein a defect-free pixel of the first modulator element has in response to a first electric signal adjustable states including
 a first state for processing the first light beam such that a portion of the first light beam incident on the pixel is part of the spatial light pattern and a second different state for processing the first light beam such that the spatial light pattern is substantially free of the portion of the first light beam,
a further defect-free pixel of the second modulator element has in response to the second electric signal adjustable states comprising
a first state for processing the second light beam such that a portion of the second light beam incident on the pixel is part of the spatial light pattern, and
a second different state for processing the second light beam such that the spatial light pattern is substantially free of the portion of the second light beam,
the first modulator element and the second modulator elements being arranged such that when the defect-free pixel of the first modulator element and the further defect-free pixel of the second modulator element are in their respective first states, the portion of the first light beam and the portion of the second light beam in the spatial light pattern are arranged to substantially coincide.

17. Method as claimed in claim 16, wherein the first electric signal and the second electric signal are chosen to prevent that the pixel of the first modulator element and the pixel of the second modulator element are simultaneously in their respective first state.

* * * * *